United States Patent

Ngo et al.

[11] Patent Number: 6,143,672
[45] Date of Patent: Nov. 7, 2000

[54] METHOD OF REDUCING METAL VOIDINGS IN 0.25 μM AL INTERCONNECT

[75] Inventors: Minh Van Ngo, Union City; Simon S. Chan, Saratoga; Suzette K. Pangrle, Cupertino; Robert A. Huertas, Hollister, all of Calif.

[73] Assignee: Advanced Micro Devices, Inc., Sunnyvale, Calif.

[21] Appl. No.: 09/084,442

[22] Filed: May 22, 1998

[51] Int. Cl.[7] .......................... H01L 21/76; H01L 21/469
[52] U.S. Cl. .......................... 438/787; 438/435; 438/437; 438/778; 438/787; 438/788; 438/791; 438/792
[58] Field of Search ..................... 438/778, 787, 438/763, 788, 791, 792, 958, 404, 424, 435, 437

[56] References Cited

U.S. PATENT DOCUMENTS

| | | | |
|---|---|---|---|
| 5,068,124 | 11/1991 | Batey et al. | 427/39 |
| 5,504,017 | 4/1996 | Yue et al. | 437/8 |
| 5,549,786 | 8/1996 | Jones et al. | 156/662.1 |
| 5,621,241 | 4/1997 | Jain | 257/632 |
| 5,654,589 | 8/1997 | Huang et al. | 257/763 |
| 5,674,781 | 10/1997 | Huang et al. | 437/192 |
| 5,691,573 | 11/1997 | Avanzino et al. | 257/758 |

Primary Examiner—John F. Niebling
Assistant Examiner—Ha Tran Nguyen
Attorney, Agent, or Firm—Renner, Otto, Boisselle & Sklar, LLP

[57] ABSTRACT

In one embodiment, the present invention relates to a method of depositing a dielectric layer over a stacked interconnect structure, involving the steps of: providing a substrate having at least one stacked interconnect structure comprising at least one of an aluminum layer and an aluminum alloy layer; depositing the dielectric layer over the stacked interconnect structure under a pressure from about 1 mTorr to about 6 mTorr, an $O_2$ flow rate from about 110 sccm to about 130 sccm and a silane flow rate from about 52 sccm to about 60 sccm at a bias power from about 2500 W to about 3100 W, under a pressure from about 2 Torr to about 2.8 Torr, an $N_2$ flow rate from about 7 l to about 11.5 l, an $N_2O$ flow rate from about 1 l to about 2 l and a silane flow rate from about 250 sccm to about 300 sccm at a power from about 900 W to about 1300 W at a temperature from about 300° C. to about 350° C., or under a pressure from about 2 Torr to about 2.8 Torr, an $N_2$ flow rate from about 7 l to about 11.5 l, an $N_2O$ flow rate from about 1 l to about 2 l and a silane flow rate from about 80 sccm to about 120 sccm at a power from about 900 W to about 1300 W at a temperature from about 390° C. to about 410° C.

17 Claims, 1 Drawing Sheet

METHOD OF REDUCING METAL VOIDINGS IN 0.25 μM AL INTERCONNECT

TECHNICAL FIELD

As a result of the present invention, integrated circuits having high electric reliability due to reduced metal voidings in the stack interconnect structures therein. According to the present invention, an interlayer dielectric (ILD) can be deposited in a nonsevere manner thus decreasing the stress on underlying stack interconnect structures. The present invention also provides a high quality ILD that can be deposited in narrow gaps.

BACKGROUND OF THE INVENTION

An integrated circuit consists of electronic devices electrically coupled by conductive trace elements called interconnect lines (interconnects). Interconnects are patterned from layers of electrically conductive materials (e.g., aluminum, doped polysilicon, etc.) formed on the surface of a silicon wafer. Multiple layers (or levels) of closely-spaced interconnects allow an increase in the density of devices formed on semiconductor wafers. Electrical separation of stacked interconnect layers is achieved by placing an electrically insulating material (i.e., interlevel dielectric layer) between the vertically spaced interconnect layers.

In very large scale integrated (VLSI) circuit devices, several wiring layers are often required to connect together the active and/or passive elements in a VLSI semiconductor chip. The interconnection structure typically consists of thin conductive lines separated by insulation in one layer or level and connected through vias or studs from contacts of the elements of the semiconductor chip or to a similar layer in another level of interconnections. With the trend to higher and higher levels of integration in semiconductor devices to ultra large scale integrated (ULSI) circuits, the space or gap between the wires or conductive lines to be filled with insulation is becoming extremely narrow between some of the conductive lines, such as about 0.5 microns and smaller. In addition, when the height of the conductive lines is increased, it is more difficult to fill gaps between the lines, especially when the aspect ratio is 2 to 1 or greater with a gap distance of 0.5 microns or smaller.

In order to satisfy increasingly higher density requirements, the dimensions of integrated circuits are continuously reduced and, hence, the line widths of the conductors decreased into the submicron range. While the conductors become narrower and narrower, the stresses imposed upon the conductive material increase, thereby resulting in a high failure rate. Many of these failures stem from defects or voids generated by stress migration as a result of thermal stresses caused by exposure at different temperatures or to subsequent processing. Other types of voids are generated by electromigration and during various production steps, such as etching. These voids, which can range from 0.1 microns to about 10 microns or more, ultimately lead to failures in narrow electrical lines by causing open circuits.

Interconnects are typically made of a metal stack structure. Multilayer interconnect structures can be made of two, three, and even four or more layers of metal or metal alloys. After formation of the stacked interconnect structures and appropriate patterning, an interlayer dielectric (ILD) is deposited. A conventional three layer stacked interconnect structure is shown in FIGS. 1A and 1B. Referring to FIG. 1B, stacked interconnect structure 12 is situated on a substrate 10, both of which are covered by an ILD material 14. The ILD serves to electrically separate stacked interconnect layers and structures. However, there are problems associated with depositing the ILD over the stacked interconnect structures.

When depositing the metal or metal alloy layers of the stacked interconnect structure or during subsequent thermal processing, in some instances metal alloys are newly formed at the interfaces of the individual layers. The newly formed metal alloys are constituted by the metals of the adjacent layers at a given interface. The formation of such newly formed metal alloys causes problems, especially when the newly formed metal alloy or alloys occupies less space or volume compared to the metals or metal alloys which make up the individual layers. When a newly formed metal alloy occupies less space (contraction in volume), voids are formed along the interconnect. The formation of metal voids is undesirable because they can lead to broken or inefficient lines and thus open, unreliable or faulty circuits.

For example, referring to FIG. 1A, in the case of a three layer stacked interconnect structure 12 made by depositing titanium nitride 12c over an aluminum alloy (e.g., Al with 1% Cu) 12b which in turn is deposited over a layer of titanium 12a, and patterning the metal stack into metal lines. Al and Ti at the aluminum alloy/titanium interface interact to form $TiAl_3$ during deposition of the aluminum alloy or subsequent thermal processing. Since $TiAl_3$ occupies less volume than either the aluminum alloy or titanium, it is believed that small voids 16 may be formed as indicated in the Ti/Al alloy/TiN stacked interconnect structure 12. Nevertheless, due to cooling from the ILD deposition temperature, the metals and metal alloys of the stacked interconnect structure attempt to contract more than its surroundings permit, leading to the generation of large hydrostatic strains in the metal lines. The hydrostatic strains result in metal contraction. Consequently, referring to FIG. 1B, large voids 18 are formed at the Ti/Al alloy interface in the Ti/Al alloy/TiN stacked interconnect structure 12, especially at the sidewall of the metal lines where the temperature effects are most pronounced.

The occurrence of voids attributable to the formation of $TiAl_3$ is typically unavoidable at 390° C. or higher processing temperatures and the cooling effects of ILD deposition. In particular, deposition of the ILD promotes an increase in metal voiding (both an increase in size of existing voids in the metal and an increase in the number of metal voids), for example as shown in FIG. 1B (compared to FIG. 1A). Voiding is a particular problem in stacked interconnect structures containing at least one layer of aluminum or aluminum alloy. It is desirable to provide an integrated circuit having stacked interconnect structures with reduced metal voidings in order to prevent failures in electrical lines due to open circuits thus increasing reliability.

SUMMARY OF THE INVENTION

In one embodiment, the present invention relates to a method of depositing a dielectric layer over a stacked interconnect structure, involving the steps of: providing a substrate having at least one stacked interconnect structure comprising at least one of an aluminum layer and an aluminum alloy layer; depositing the dielectric layer over the stacked interconnect structure under a pressure from about 1 mTorr to about 6 mTorr, an $O_2$ flow rate from about 110 sccm to about 130 sccm and a silane flow rate from about 52 sccm to about 60 sccm at a bias power from about 2500 W to about 3100 W in a high density plasma single wafer processing chamber, under a pressure from about 2 Torr to about 2.8 Torr, an N$_2$ flow rate from about 7 l to about 11.5 l, an N$_2$O flow rate from about 1 l to about 2 l and a silane flow rate from about 250 sccm to about 300 sccm at a power from about 900 W to about 1300 W at a temperature from about 300° C. to about 350° C. in a plasma enhanced chemical vapor deposition multiple deposition chamber, or under a pressure from about 2 Torr to about 2.8 Torr, an N$_2$ flow rate from about 7 l to about 11.5 l, an N$_2$O flow rate from about 1 l to about 2 l and a silane flow rate from about 80 sccm to about 120 sccm at a power from about 900 W to about 1300 W at a temperature from about 390° C. to about 410° C. in a plasma enhanced chemical vapor deposition multiple deposition chamber.

In another embodiment, the present invention relates to a method of reducing formation of voidings in a stacked interconnect structure comprising a titanium layer adjacent a layer comprising aluminum, involving the steps of: providing a substrate having the stacked interconnect structure; depositing the dielectric layer over the stacked interconnect structure and at least a part of the substrate under a pressure from about 1 mTorr to about 6 mTorr, an O$_2$ flow rate from about 110 sccm to about 130 sccm and a silane flow rate from about 52 sccm to about 60 sccm at a bias power from about 2500 W to about 3100 W, under a pressure from about 2 Torr to about 2.8 Torr, an N$_2$ flow rate from about 7 l to about 11.5 l, an N$_2$O flow rate from about 1 l to about 2 l and a silane flow rate from about 250 sccm to about 300 sccm at a power from about 900 W to about 1300 W at a temperature from about 300° C. to about 350° C., or under a pressure from about 2 Torr to about 2.8 Torr, an N$_2$ flow rate from about 7 l to about 11.5 l, an N$_2$O flow rate from about 1 l to about 2 l and a silane flow rate from about 80 sccm to about 120 sccm at a power from about 900 W to about 1300 W at a temperature from about 390° C. to about 410° C.

In yet another embodiment, the present invention relates to a method of depositing a silicon dioxide interlayer dielectric layer over a stacked interconnect structure, involving the steps of: providing a substrate having at least one stacked interconnect structure comprising a titanium layer adjacent at least one of an aluminum layer and an aluminum alloy layer; depositing the silicon dioxide interlayer dielectric layer over the stacked interconnect structure under a pressure from about 1 mTorr to about 6 mTorr, an O$_2$ flow rate from about 115 sccm to about 125 sccm and a silane flow rate from about 54 sccm to about 58 sccm at a bias power from about 2550 W to about 3050 W, under a pressure from about 2 Torr to about 2.8 Torr, an N$_2$ flow rate from about 8 l to about 11 l, an N$_2$O flow rate from about 1 l to about 2 l and a silane flow rate from about 260 sccm to about 290 sccm at a power from about 1000 W to about 1200 W at a temperature from about 310° C. to about 340° C., or under a pressure from about 2 Torr to about 2.8 Torr, an N$_2$ flow rate from about 8 l to about 11 l, an N$_2$O flow rate from about 1 l to about 2 l and a silane flow rate from about 90 sccm to about 110 sccm at a power from about 1000 W to about 1200 W at a temperature from about 390° C. to about 410° C.

As a result of the present invention, it is possible to reduce metal voiding in stacked interconnects containing a layer of aluminum or aluminum alloy. Reduced metal voiding enables the production of electrical devices of high reliability. Moreover, disadvantages associated with the use of aluminum or aluminum alloy in stacked interconnect structures are minimized or overcome by the present invention.

DETAILED DESCRIPTION OF THE INVENTION

Figure 1A:
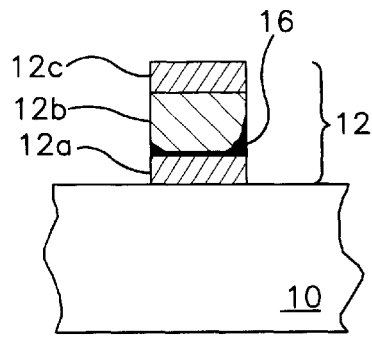
FIGS. 1A and 1B illustrate a stacked interconnect structure with an ILD deposited thereover in a conventional manner.
Figure 1B:
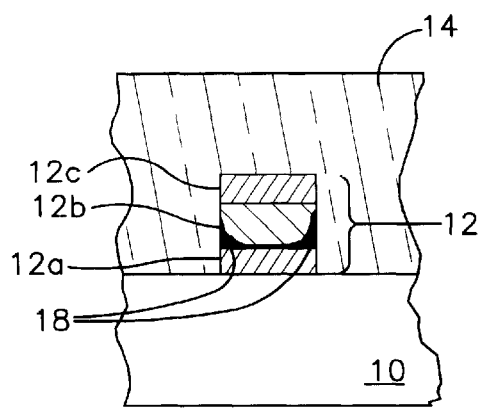

The present invention involves depositing an ILD over a stacked interconnect structure in a nonsevere manner using either high density plasma (HDP) chemical vapor deposition (CVD) techniques or plasma enhanced chemical vapor deposition (PECVD) techniques. The ILD is typically made of silicon dioxide.

The stacked interconnect structure generally has at least two metal or metal alloy layers and can be a two-layered stacked interconnect structure, a three-layered stacked interconnect structure, a four-layered stacked interconnect structure, and so on. In a preferred embodiment, the stacked interconnect structure contains at least one layer of aluminum or aluminum alloy. Aluminum alloys include aluminum and from about 0.1% to about 10% by weight of one or more of copper, nickel, zinc, gold, titanium, indium, chromium, silver, palladium and platinum. In a more preferred embodiment, the stacked interconnect structure contains at least one layer of aluminum or aluminum alloy adjacent a layer containing titanium.

In one embodiment, the SiO$_2$ based ILD is deposited over a stacked interconnect structure using HDP CVD techniques. HDP is conducted in a chamber evacuated to a pressure from about 1 to about 6 mTorr, an O$_2$ flow rate from about 110 sccm to about 130 sccm and an SiH$_4$ flow rate from about 52 sccm to about 60 sccm, and from about 2500 W to about 3100 W of bias power to deposit SiO$_2$. In a preferred embodiment, HDP is conducted in a chamber evacuated to a pressure from about 1 to about 6 mTorr, an O$_2$ flow rate from about 115 sccm to about 125 sccm and an SiH$_4$ flow rate from about 54 sccm to about 58 sccm, and from about 2550 W to about 3050 W of bias power to deposit SiO$_2$. The temperature, which largely depends upon the bias power, is about 340° C. at a bias power of 3000 W. Under these conditions and parameters, an ILD of high quality may be deposited without causing the formation of additional metal voids and/or increasing the size of metal voids already present in an underlying stacked interconnect structure.

In another embodiment, an SiO$_2$ based ILD is deposited over a stacked interconnect structure using PECVD techniques. Using PECVD techniques, one of two alternative embodiments can be used. The two alternative embodiments include a low temperature embodiment and a low silane flow rate embodiment. Under the conditions and parameters described below for the two alternative embodiments, an ILD of high quality may be deposited without causing the formation of additional metal voids and/or increasing the size of metal voids already present in an underlying stacked interconnect structure. Also under the conditions and parameters described below for the two alternative embodiments, an ILD of high quality (substantially no voids in the ILD)

can be deposited, even in narrow gaps (gap between two stacked interconnect structures).

In the low temperature embodiment, PECVD is conducted at a temperature from about 300° C. to about 350° C., flow rates of $N_2$ from about 7 l to about 11.5 l, $N_2O$ from about 1 l to about 2 l, and $SiH_4$ from about 250 sccm to about 300 sccm, from about 900 W to about 1300 W of power, and under about 2 to about 2.8 Torr of pressure. In a preferred version of the low temperature embodiment, PECVD is conducted at a temperature from about 310° C. to about 340° C., flow rates of $N_2$ from about 8 l to about 11 l, $N_2O$ from about 1 l to about 2 l, and $SiH_4$ from about 260 sccm to about 290 sccm, from about 1000 W to about 1200 W of power, and under about 2 to about 2.8 Torr of pressure.

In the low silane flow rate embodiment, PECVD is conducted at a temperature from about 390° C. to about 410° C., flow rates of $N_2$ from about 7 to about 11.5 l, $N_2O$ from about 1 to about 2 l, and $SiH_4$ from about 80 sccm to about 120 sccm, from about 900 W to about 1300 W of power, and under about 2 to about 2.8 Torr of pressure. In a preferred version of the low silane flow rate embodiment, PECVD is conducted at a temperature from about 390° C. to about 410° C., flow rates of $N_2$ from about 8 to about 11 l, $N_2O$ from about 1 to about 2 l, and $SiH_4$ from about 90 sccm to about 110 sccm, from about 1000 W to about 1200 W of power, and under about 2 to about 2.8 Torr of pressure.

The $SiO_2$ based ILD may be deposited to provide an ILD of any desired depth or thickness for a given application. Typically, however, an $SiO_2$ based ILD is deposited to a thickness from about 8,000 Å to about 20,000 Å. In a preferred embodiment, an $SiO_2$ based ILD is deposited to a thickness of about 10,000 Å to about 18,000 Å. The thickness of the ILD, of course, may vary depending on the presence or absence of various devices on the wafer over which the ILD is deposited. In this connection, the thickness parameter is equal to the average thickness measured from the top surface of the deposited ILD layer to the bottom surface (bottom interface with either another oxide, a stack interconnect structure and the like).

Figure 2A:
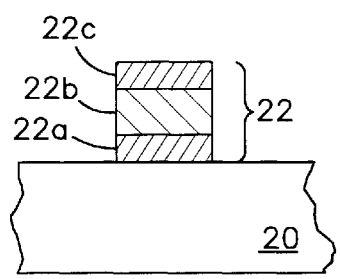
FIGS. 2A and 2B illustrate a stacked interconnect structure with an ILD deposited thereover in accordance with the present invention.
Figure 2B:
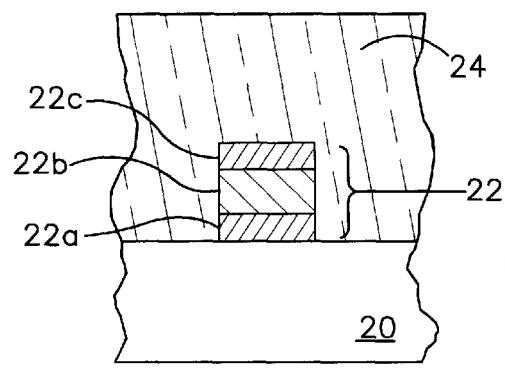

Referring to FIGS. 2A and 2B, a several specific embodiments of practicing the present invention are described. Referring to FIG. 2A, a stacked interconnect structure 22 of Ti/Al alloy/TiN are shown in cross section on a substrate 20. The stacked interconnect structure 22 includes a bottom layer of Ti 22a, a middle layer of an Al alloy 22b, such as Al with about 1% Cu or Al with about 0.5% copper, although substantially pure Al may also be used as the Al alloy, and a top layer of TiN 22c. Although not shown, the substrate 20 may include a number of devices, such as MOSFET devices, electrically connected to the stacked interconnect structures 22 via a metal plug. Moreover, although only one stacked interconnect structure 22 is shown, it will be appreciated that several other substantially identical structures may be included on the substrate 20.

Referring to FIG. 2B, in one embodiment, an $SiO_2$ based ILD 24 is deposited over the stacked interconnect structure 22 and the substrate 20 using HDP techniques. Specifically, ILD layer 24 is deposited in a chamber under a pressure of about 3 mTorr, an $O_2$ flow rate of 120 sccm and silane flow rate of about 56 sccm at 3000 W of bias power. The temperature during deposition is about 340° C. During deposition of ILD layer 24 and subsequent thermal processing, no metal voids are formed in the stacked interconnect structure 22. Accordingly, reliable stacked interconnect structures are provided.

Referring again to FIG. 2B, in another embodiment, an $SiO_2$ based ILD 24 is deposited over the stacked interconnect structure 22 and the substrate 20 using PECVD techniques. Specifically, ILD layer 24 is deposited in a chamber under a pressure of about 2.4 Torr, an $N_2$ flow rate of 9 l, an $N_2O$ flow rate of 1.5 l and a silane flow rate of about 275 sccm at 1100 W of power at a temperature of 325° C. During deposition of ILD layer 24 and subsequent thermal processing, no metal voids are formed in the stacked interconnect structure 22. Accordingly, reliable stacked interconnect structures are provided.

Referring again to FIG. 2B, in yet another embodiment, an $SiO_2$ based ILD 24 is deposited over the stacked interconnect structure 22 and the substrate 20 using PECVD techniques. Specifically, ILD layer 24 is deposited in a chamber under a pressure of about 2.4 Torr, an $N_2$ flow rate of 9 l, an $N_2O$ flow rate of 1.5 l and a silane flow rate of about 100 sccm at 1100 W of power at a temperature of 400° C. During deposition of ILD layer 24 and subsequent thermal processing, no metal voids are formed in the stacked interconnect structure 22. Accordingly, reliable stacked interconnect structures are provided.

Although not shown, further processing may involve electrically connecting stacked interconnect structure 22 to another stacked interconnect structure on a layer subsequently formed above stacked interconnect structure 22 via a metal plug. Such structures are common in multilayered circuits.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of depositing a dielectric layer over a stacked interconnect structure, comprising:

providing a substrate having at least one stacked interconnect structure comprising at least one of an aluminum layer and an aluminum alloy layer;

depositing the dielectric layer over the stacked interconnect structure under a condition selected from the following conditions under a pressure from about 2 Torr to about 2.8 Torr, an $N_2$ flow rate from about 7 l to about 11.5 l, an $N_2O$ flow rate from about 1 l to about 2 l and a silane flow rate from about 250 sccm to about 300 sccm at a power from about 900 W to about 1300 W at a temperature from about 300° C. to about 350° C., and under a pressure from about 2 Torr to about 2.8 Torr, an $N_2$ flow rate from about 7 l to about 11.5 l, an $N_2O$ flow rate from about 1 l to about 2 l and a silane flow rate from about 80 sccm to about 120 sccm at a power from about 900 W to about 1300 W at a temperature from about 390° C. to about 410° C.

2. The method according to claim 1, wherein the stacked interconnect structure comprises a titanium layer over the substrate, an aluminum layer over the titanium layer, and a titanium nitride layer over the aluminum layer.

3. The method according to claim 1, wherein the stacked interconnect structure comprises a titanium layer over the substrate, an aluminum alloy layer over the titanium layer, and a titanium nitride layer over the aluminum alloy layer.

4. The method according to claim 3, wherein the aluminum alloy layer comprises aluminum and copper.

5. The method according to claim 1, wherein the dielectric layer is a silicon dioxide interlayer dielectric layer.

6. The method according to claim 1, wherein the dielectric layer is deposited under a pressure from about 2 Torr to about 2.8 Torr, an $N_2$ flow rate from about 7 l to about 11.5 l, an $N_2O$ flow rate from about 1 l to about 2 l and a silane flow rate from about 250 sccm to about 300 sccm at a power form about 900 W to about 1300 W at a temperature from about 300° C. to about 350° C.

7. The method according to claim 1, wherein the dielectric layer is deposited under a pressure from about 2 Torr to about 2.8 Torr, an $N_2$ flow rate from about 7 l to about 11.5 l, an $N_2O$ flow rate from about 1 l to about 2 l and a silane flow rate from about 80 sccm to about 120 sccm at a power from about 900 W to about 1300 W at a temperature from about 390° C. to about 410° C.

8. The method according to claim 1, wherein the dielectric layer is deposited under a pressure from about 2 Torr to about 2.8 Torr , an $N_2$ flow rate from about 8 l to about 11 l, an $N_2O$ flow rate from about 1 l to about 2 l and a silane flow rate from about 260 sccm to about 290 sccm at a power from about 1000 W to about 1200 W at a temperature from about 310° C. to about 340° C.

9. The method according to claim 1, wherein the dielectric layer is deposited under a pressure from about 2 Torr to about 2.8 Torr , an $N_2$ flow rate from about 8 l to about 11 l, an $N_2O$ flow rate from about 1 l to about 2 l and a silane flow rate from about 90 sccm to about 110 sccm at a power from about 1000 W to about 1200 W at a temperature from about 390° C. to about 410° C.

10. A method of reducing formation of voidings in a stacked interconnect structure comprising a titanium layer adjacent a layer comprising aluminum, comprising:

providing a substrate having the stacked interconnect structure;

depositing the dielectric layer over the stacked interconnect structure and at least a part of the substrate under a condition selected from the following conditions
under a pressure from about 2 Torr to about 2.8 Torr, an $N_2$ flow rate from about 7 l to about 11.5 l, an $N_2O$ flow rate from about 1 l to about 2 l and a silane flow rate from about 250 sccm to about 300 sccm at a power from about 900 W to about 1300 W at a temperature from about 300° C. to about 350° C., and under a pressure from about 2 Torr to about 2.8 Torr, an $N_2$ flow rate from about 7 l to about 11.5 l, an $N_2O$ flow rate from about 1 l to about 2 l and a silane flow rate from about 80 sccm to about 120 sccm at a power from about 900 W to about 1300 W at a temperature from about 390° C. to about 410° C.

11. The method according to claim 10, wherein the stacked interconnect structure comprises a titanium layer over the substrate, an aluminum layer over the titanium layer, and a titanium nitride layer over the aluminum layer.

12. The method according to claim 10, wherein the stacked interconnect structure comprises a titanium layer over the substrate, an aluminum alloy layer over the titanium layer, and a titanium nitride layer over the aluminum alloy layer.

13. The method according to claim 12, wherein the aluminum alloy layer comprises aluminum and copper.

14. The method according to claim 10, wherein the dielectric layer is a silicon dioxide interlayer dielectric layer.

15. The method according to claim 10, wherein the dielectric layer is deposited under a pressure from about 2 Torr to about 2.8 Torr, an $N_2$ flow rate from about 8 l about 11 l, an $N_2O$ flow rate from about 1 l to about 2 l and a silane flow rate from about 260 sccm to about 290 sccm at a power from about 1000 W to about 1200 W at a temperature from about 310° C. to about 340° C.

16. The method according to claim 10, wherein the dielectric layer is deposited under a pressure from about 2 Torr to about 2.8 Torr, an $N_2$ flow rate from about 8 l to about 11 l, an $N_2O$ flow rate from about 1 l to about 2 l and a silane flow rate from about 90 sccm to about 110 sccm at a power from about 1000 W to about 1200 W at a temperature from about 390° C. to about 410° C.

17. A method of depositing a silicon dioxide interlayer dielectric layer over a stacked interconnect structure, comprising:

providing a substrate having at least one stacked interconnect structure comprising a titanium layer adjacent at least one of an aluminum layer and an aluminum alloy layer;

depositing the silicon dioxide interlayer dielectric layer over the stacked interconnect structure under a condition selected from the following conditions
under a pressure from about 2 Torr to about 2.8 Torr, an $N_2$ flow rate from about 8 l to about 11 l, an $N_2O$ flow rate from about 1 l to about 2 l and a silane flow rate from about 260 sccm to about 290 sccm at a power from about 1000 W to about 1200 W at a temperature from about 310° C. to about 340° C., and under a pressure from about 2 Torr to about 2.8 Torr, an $N_2$ flow rate from about 8 l to about 11 l, an $N_2O$ flow rate from about 1 l to about 2 l and a silane flow rate from about 90 sccm to about 110 sccm at a power from about 1000 W to about 1200 W at a temperature from about 390° C. to about 410° C.

* * * * *

UNITED STATES PATENT AND TRADEMARK OFFICE
CERTIFICATE OF CORRECTION

PATENT NO. : 6,143,672

DATED : November 7, 2000

INVENTOR(S) : Minh Van Ngo et al.

It is certified that error appears in the above-identified patent and that said Letters Patent is hereby corrected as shown below:

Column 2, line 29, please replace "Ti/A1" with --Ti/Al--.

Signed and Sealed this

Fifteenth Day of May, 2001

*Attest:*

NICHOLAS P. GODICI

*Attesting Officer*   Acting Director of the United States Patent and Trademark Office